United States Patent [19]

Campbell

[11] Patent Number: 4,591,859
[45] Date of Patent: May 27, 1986

[54] RADAR TRANSMITTER

[75] Inventor: Richard A. Campbell, Concord, Mass.

[73] Assignee: Raytheon Company, Lexington, Mass.

[21] Appl. No.: 419,678

[22] Filed: Sep. 20, 1982

[51] Int. Cl.[4] .................. G01S 7/28; H04B 1/04
[52] U.S. Cl. ...................... 343/5 AF; 343/17.2 R; 455/126
[58] Field of Search ............ 343/5 AF, 7 PL, 17.2 R, 343/17.5; 331/22, 25, 30, 31, 32, 17; 455/75, 119, 76, 113, 114, 126

[56] References Cited

U.S. PATENT DOCUMENTS

| 2,550,519 | 4/1951 | Bataille | 331/31 X |
|---|---|---|---|
| 2,875,337 | 2/1959 | Robinson | 331/22 X |
| 3,644,831 | 2/1972 | Latker et al. | 455/113 X |
| 3,831,094 | 8/1974 | Stover | 332/37 DX |
| 3,882,424 | 5/1975 | Debois et al. | 455/113 X |

OTHER PUBLICATIONS

M. Lewis, "A Compact Agile Microwave Frequency Generator for Radar Applications", Oct. 1978, pp. 234–237; Military Microwaves 78 Conf. Proc., London, England.
"A Compact High-Power, Agile Microwave Source" Electron (GB) No. 106, Nov. 18 1976, pp. 57–58.

Primary Examiner—Nelson Moskowitz
Assistant Examiner—Gilberto Barrón, Jr.
Attorney, Agent, or Firm—Philip J. McFarland; Richard M. Sharkansky

[57] ABSTRACT

A radar transmitter is shown to include a voltage-controlled oscillator and associated amplifier to produce a signal to be transmitted with any noise generated within such oscillator and amplifier being reduced to a minimum by extracting a sample of the signal to be transmitted, downconverting such sample and then phase detecting the downconverted sample to derive a control signal for such oscillator.

3 Claims, 1 Drawing Figure

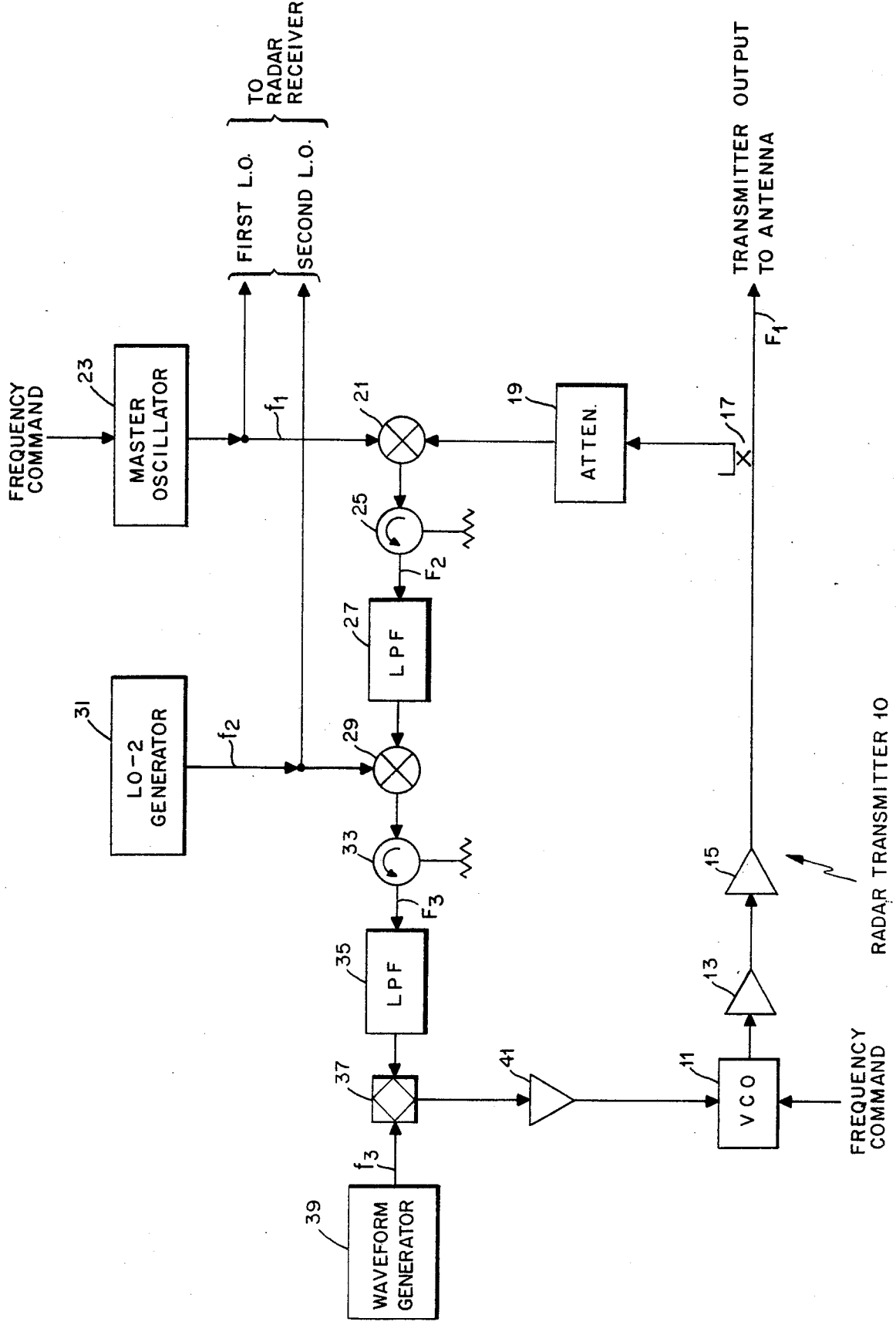

RADAR TRANSMITTER

BACKGROUND OF THE INVENTION

This invention pertains generally to radar transmitters, and particularly to an improved frequency-agile transmitter wherein non-common mode noise is significantly reduced.

In the field of radar countermeasures a requirement for transmitters having wider bandwidths, frequency agility and lower noise has been increasingly evident. To meet the need for frequency agility, and at the same time provide waveform diversity, transmitter designs have been developed wherein the microwave source comprises a combination of two, or more, separate microwave generators whose output signals are combined and amplified in relatively broadband amplifiers prior to being transmitted. While a wide operating bandwidth may be obtained with any of such transmitter designs, spurious signals and increased noise levels are also experienced. Such spurious signals are intermodulation products that occur when the output signals of two, or more, separate microwave generators are combined. Those spurious signals falling within the wide operating bandwidth of the transmitter cannot easily be eliminated by filtering. As a result, then, spurious signals detract from the purity of the transmitted waveform.

With respect to the problem of increased transmitter noise, a distinction must be made between "common mode" noise, i.e. noise present on both the transmitted and local oscillators signals, and "non-common mode" noise, i.e., noise generated within the transmitter amplifiers. While common mode noise may be partially cancelled, the wide instantaneous bandwidths required for frequency agility usually result in amplifiers having increased non-common mode noise levels vis-a-vis those used for narrow band operation.

SUMMARY OF THE INVENTION

With this background of the invention in mind it is therefore a primary object of this invention to provide a broadband, frequency-agile radar transmitter wherein the non-common mode noise is significantly reduced.

It is another object of this invention to provide a broadband radar transmitter wherein undesired mixer produces are reduced.

The foregoing and other objects of this invention are attained generally by providing a radar transmitter wherein the transmitted signal is generated by a voltage-controlled oscillator (VCO) having a bandwidth covering the desired operating band. An amplifier is provided to raise the output signal from the VCO to the required power level and a sample of the output of the amplifier is downconverted and fed back to control the VCO, thereby degenerating any non-common mode noise.

BRIEF DESCRIPTION OF THE DRAWINGS

Other objects and many of the attendant advantages of this invention will be readily appreciated as the same becomes better understood by reference to the following detailed description when considered in connection with the accompanying drawing, the single FIGURE of which is a functional block diagram of a broad-band transmitter according to this invention.

DESCRIPTION OF THE PREFERRED EMBODIMENT

Referring now to the single FIGURE, a radar transmitter 10 according to this invention is shown to include a broadband voltage-controlled oscillator (VCO 11) as the primary signal source. The output signal from the VCO 11 is amplified in a pair of amplifiers 13, 15, and passed, through a directional coupler 17, to the radar antenna (not shown). A sample of the transmitted signal then is provided, through an attenuator 19, as an input to a mixer 21. The second input signal to the mixer 21 is obtained from a frequency-agile master oscillator 23, which is here of conventional design. The frequency-agile master oscillator 23 also supplies the first local oscillator (L.O.) signal, $f_1$, to the radar receiver (not shown). The mixer 21 is then effective to downconvert the transmitter output signal, $F_1$, to a first intermediate frequency (I.F.) signal, $F_2$, where $F_2 = F_1 - f_1$. The first I.F. signal from the mixer 21 is passed, via an isolator 25 and a low pass filter 27, to a second downconversion mixer 29. The second input signal to the second downconversion mixer 29 is obtained from a LO-2 generator 31 that produces a signal at a frequency $f_2$. The LO-2 generator 31 also provides the second L.O. signal to the radar receiver (not shown). The mixer 29 is effective to downconvert the first I.F. frequency to a second I.F. frequency of $F_3$, where $F_3 = F_2 - f_2$. The second I.F. frequency from the mixer 29 is passed, via an isolator 33 and a low pass filter 35, to a phase detector 37. The second input signal to the latter is provided by a waveform generator 39 at a frequency $f_3$. The error output signal from the phase detector 37 is passed, via a loop shaping amplifier 41, as a control signal to the VCO 11.

It will now be appreciated by those of skill in the art that the just-recited elements comprise a phase-lock control loop (not numbered) around the VCO 11. The non-common mode noise generated within the VCO 11 and the amplifiers 13, 15 is degenerated (reduced) by an amount proportional to the open loop gain of the phase-lock control loop.

It will also be appreciated that the generation of spurious mixer products is reduced by the use of downconverters in the control loop. That is to say, downconverters exhibit lower level spurious signals that do upconverters operating at the same frequencies. Thus, a conventional transmitter using upconverters would use the conversion process:

$$f_3 + f_2 = F_2 \tag{Eq. 1}$$

$$F_2 + f_1 = F_1 \tag{eq. 2}$$

so that $$f_1 + f_2 + f_3 = F_1. \tag{Eq. 3}$$

The contemplated transmitter design, utilizing downconverters, yields the following conversion process:

$$F_1 - f_1 = F_2 \tag{Eq. 4}$$

$$F_2 - f_2 = F_3 = f_3 \tag{Eq. 5}$$

so that $$F_1 - f_1 - f_2 = f_3. \tag{Eq. 6}$$

Equations (1) and (5) are equivalent, as are Equations (2) and (4), but the downconverter process, Equations (4) and (5), produces less undesired mixer products than the upconverter process given by Equations (1) and (2).

The objective of reducing spurious mixer products is also facilitated by the use of relatively simple low pass filters for the rejection of undesired signals. It should be noted here in passing that the isolators 25, 33 are provided between the low pass filters 27, 35 and the mixers 21, 29 to ensure that the latter are not terminated in reactive loads. It should also be noted that the VCO 11 also operates as a narrowband filter to reject spurious signals since it is connected to the phase-lock loop through the video shaping amplifier 41 which is a narrowband device.

As mentioned briefly hereinabove, the VCO 11 is the primary signal source for the transmitter 10. As such, it is tunable over the agility bandwidth in response to an externally applied FREQUENCY command derived in any known way. The master oscillator 23 is tunable over the same agility bandwidth, also in response to the FREQUECY command. The waveform generator 39 is effective to modulate the transmitted waveform as desired. Such modulation may, for example, take the form of sine wave or linear FM.

Having described a preferred embodiment of this invention, it will now be apparent to one of skill in the art that changes may be made without departing from the inventive concept described. Thus, for example, if a sample and hold circuit were provided in the video shaping amplifier to maintain the VCO frequency while the transmitter output signal was absent, the transmitter could be used in a high duty cycle pulse Doppler radar. In like manner, the transmitter could be used in a chirp radar if a D.C. restoration circuit were provided on the output of the video shaping amplifier to return the VCO to the frequency of the leading shaping amplifier to return the VCO to the frequency of the leading edge of the chirp. It is felt, therefore, that this invention should be limited only by the spirit and scope of the appended claims.

What is claimed is:

1. A radar transmitter comprising:
   (a) a voltage-controlled oscillator for generating a radio frequency signal having a frequency within a predetermined band of frequencies;
   (b) a bandpass amplifier, responsive to the radio frequency signal out of the voltage-controlled oscillator, for raising the power of such signal to a predetermined high level, such amplifier also generating a noise signal;
   (c) means for sampling and downconverting the radio frequency signal and noise signal out of the bandpass amplifier to provide a corresponding low frequency signal at a predetermined low level; and
   (d) a phase detector, responsive to the corresponding radio frequency signal at a low level and to a low frequency reference signal, for producing a frequency control signal for the voltage-controlled oscillator.

2. A radar transmitter as in claim 1 wherein the downconversion means includes a first frequency-agile oscillator and a mixer to produce a first intermediate frequency signal corresponding to the radio frequency signal and the noise signal out of the bandpass amplifier, the possible frequencies out of the first frequency-agile oscillator being within the bandwidth of the amplifier.

3. A radar transmitter as in claim 2 wherein the downconversion means includes a second fixed-frequency oscillator and a mixer to produce a second intermediate frequency signal corresponding to the first intermediate frequency signal.

* * * * *